United States Patent [19]

Peterson et al.

[11] Patent Number: 4,882,454
[45] Date of Patent: Nov. 21, 1989

[54] THERMAL INTERFACE FOR A PRINTED WIRING BOARD

[75] Inventors: Robert K. Peterson, Garland; Larry J. Mowatt, Allen; Aaron D. Poteet, Austin, all of Tex.

[73] Assignee: Texas Instruments Incorporated, Dallas, Tex.

[21] Appl. No.: 155,462

[22] Filed: Feb. 12, 1988

[51] Int. Cl.⁴ .............................................. H05K 1/00
[52] U.S. Cl. ..................... 174/68.5; 29/843; 29/846; 361/386; 361/414
[58] Field of Search ............... 174/68.5; 361/403, 386, 361/387, 414; 29/831, 832, 843, 846; 427/97

[56] References Cited

U.S. PATENT DOCUMENTS

| | | | |
|---|---|---|---|
| 3,334,395 | 8/1967 | Cook et al. | 174/68.5 |
| 3,873,756 | 3/1975 | Gall et al. | 174/68.5 |
| 4,313,026 | 1/1982 | Yamada et al. | 361/414 X |
| 4,364,100 | 12/1982 | Edmonds et al. | 174/68.5 X |
| 4,388,136 | 6/1983 | Huie et al. | 174/68.5 X |
| 4,495,378 | 1/1985 | Dotzer et al. | 174/68.5 |
| 4,713,494 | 12/1987 | Oikawa et al. | 174/68.5 |
| 4,724,283 | 2/1988 | Shimada et al. | 174/68.5 |
| 4,731,701 | 3/1988 | Kuo et al. | 361/401 |
| 4,736,521 | 4/1988 | Dohya | 174/68.5 X |

OTHER PUBLICATIONS

Teschler, Leland; New Circuit Boards Bent Heat and Vibration; Machine Design; vol. 51, No. 2; Jan. 25, 1979; pp. 105–109.
Sacher, E. et al; Printed-Circuit Boards With Low Coefficients of Expansion; IBM Technical Disclosure Bulletin; vol. 32, No. 2; Jul. 1978, p. 500.

Primary Examiner—Morris H. Nimmo
Attorney, Agent, or Firm—Rene' E. Grossman; Ferdinand M. Romano; Melvin Sharp

[57] ABSTRACT

A printed wiring board is comprised of a combination of layers providing a good thermal match with surface mount components. The board consists of a core surrounded by multiple layers of dielectric and conductive materials optimized for their thermal expansion qualities. The core is also used as a heat sink for drawing excess heat from the components. An integral thermal interface region is used to dissipate the heat from the core.

17 Claims, 5 Drawing Sheets

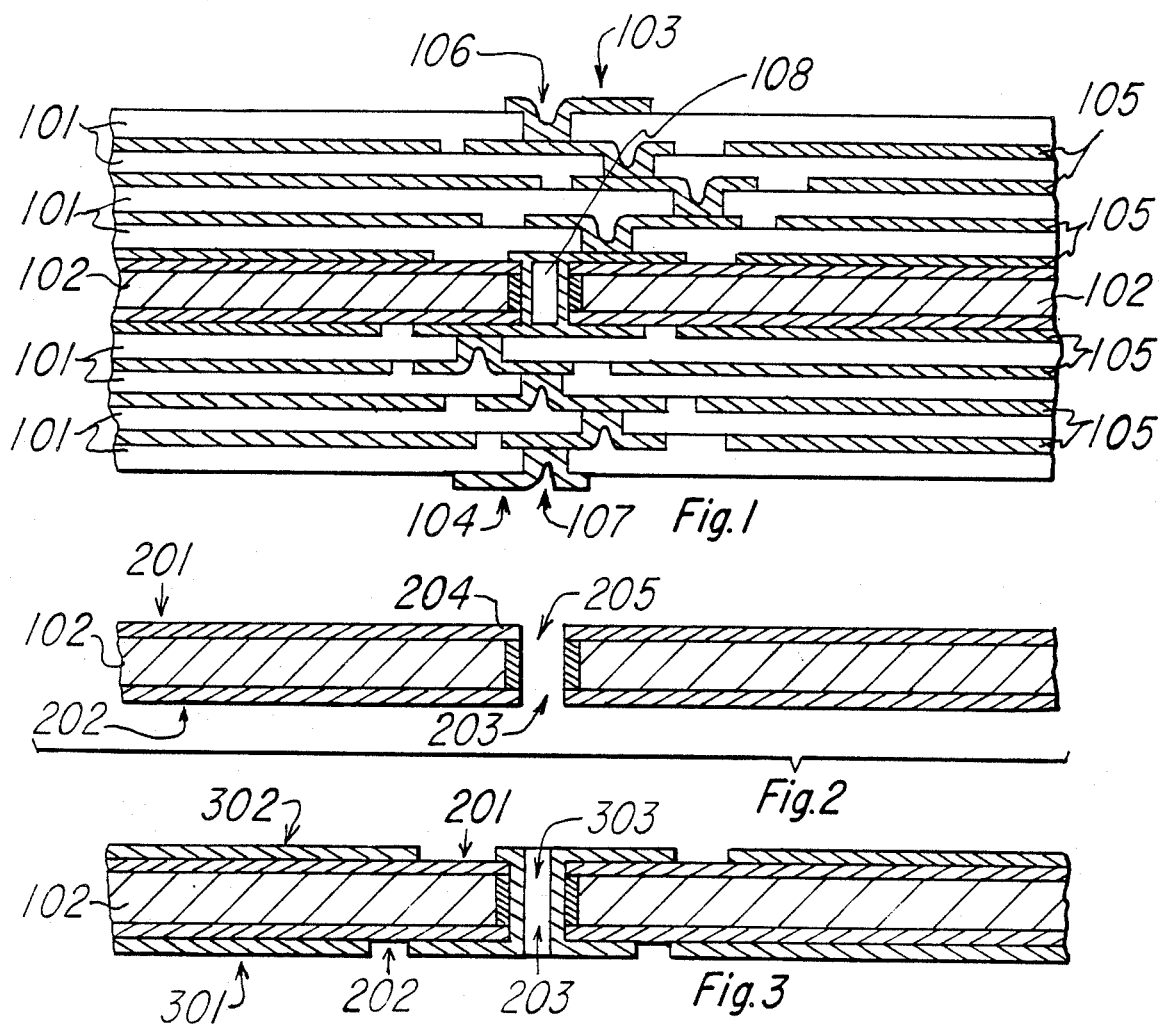

THERMAL INTERFACE FOR A PRINTED WIRING BOARD

BACKGROUND AND SUMMARY

This invention is in the field of printed wiring boards. The primary structure for assembling circuitry in the past was the use of a printed wiring board having through-holes for mounting components with attached leads. This technique imposes constraints on the component density that can be achieved. The restriction is in direct conflict with the trend toward smaller system packages that necessitate higher component density.

To relieve the leaded-package limitations, the industry has developed surface mount technology for IC packaging. This in turn has caused several problems for the printed wiring board. The first of these problems is increased heat that must be dissipated. Since the density of components has increased, then there is more thermal energy generated in a given surface area than there was using leaded technology. Therefore, the printed wiring board should provide some means for transporting the additional heat flux.

It is an object of the invention to provide a printed wiring board that functions as a heat-sink.

It is also an object of the invention to provide a structure allowing good thermal conductivity from an internal thermal plane to the exterior of the printed wiring board for removal of heat.

Another heat related problem is that of the difference in thermal coefficients between the components and the printed wiring board. The heat will cause both the individual components and the printed wiring board to expand. As there is a high probability that there is a difference in the rate of expansion. Therebetween, the solder joint between the component and the printed wiring board will be stressed. Also, deflection of the printed wiring board will produce stress in the solder joints.

It is therefore an object of the invention to have a printed wiring board structure that possesses similar thermal expansion characteristics to surface mount components to be attached.

These and other objects of the invention are achieved by: a printed wiring board adapted for mounting components thereto, said printed wiring board including:

a thermally conductive core for conducting heat generated by said components to a thermal interface region integral with said printed wiring board; and said thermal interface region having a plurality of thermally conductive vias substantially extending from said thermally conductive core to the surface of said printed wiring board.

BRIEF DESCRIPTION OF THE DRAWINGS

FIG. 1 illustrates a cross-section of the finished printed wiring board with a side-to-side interconnect.

FIGS. 2, 3, and 4 illustrate the steps of building the printed wiring board.

DETAILED DESCRIPTION OF THE INVENTION

Figure 4:
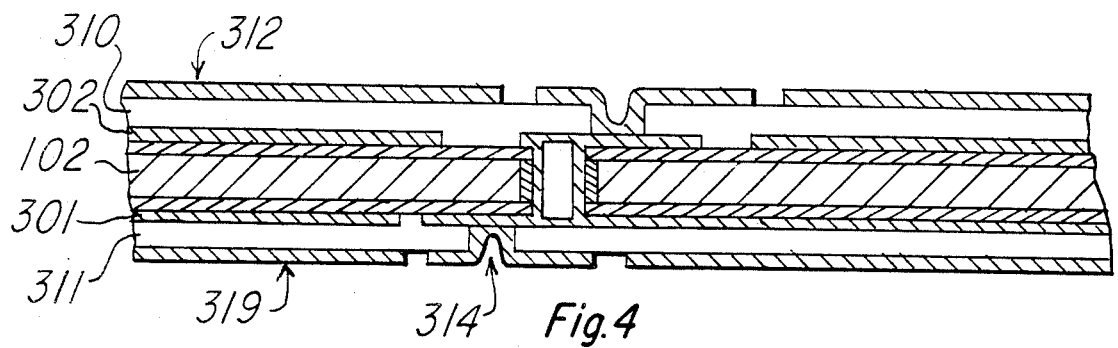

Turning now to the drawings, FIG. 1 illustrates a cross-section of a portion of the finished printed wiring board. The core section (102) is surrounded by alternating layer of conductive material (105) and dielectric material (101). This cross-section also shows two device mounting pads (103 and 104) for soldering surface-mount devices. The device mounting pads (103 and 104) are electrically interconnected by blind-plated vias (such as 106 and 107) interconnecting through the conducting layers (105) and the core (102) by way of the blind plated hole (108).

The surface mounting pads (103 and 104) for surface mount devices are elongated where the device is to be attached. There are two major reasons for this. The first purpose is to allow a greater surface area to solder on the surface mount device. The second purpose is more important. The elongated pads (103 and 104) along with the underlying vias (106 and 107) allow a spring action to be used to help absorb any difference in thermal expansion between the printed wiring board and the surface mount device. This greatly reduces the stress that is placed on the soldered connection and thus promotes reliability. Because the dielectric and restraining layers (101) ;can, in some embodiments of the invention, be somewhat pliable, the bind-plated vias (106 and 107) may be allowed to flex. This further increases the spring action for the mounting pad (103 and 104).

The core section (102) may be made of copper, copper clad invar, copper clad molybdenum, aluminum, or other suitable materials. This core not only adds structural rigidity to the finished board, but it also functions as a heat sink and as a tooling plate during construction. These uses will become apparent in the following discussion.

The dielectric materials chosen for the preferred embodiment of the invention may include aramid fibers (such as Kevlar or Nomex), a glass fabric, quartz fabric or other suitable material. Any of these materials are employed with a polymer adhesive such as epoxy or polyimide. In one preferred embodiment of the invention, the conducting layers (105) are composed of copper.

The ratio between the high expansion metal and dielectric and the low expansion rate core may be adjusted to allow a controlled CTE (coefficient of thermal expansion) circuit board to be fabricated for use with surface mount devices. Ideal performance in a surface mount application is achieved when CTE, thermal, weight and electrical properties are optimized by proper choice of materials and geometries. Core modifications can also be made to enhance thermal, CTE or weight properties when specific needs must be met. These involve the use of clad materials in the core, or composite cores of graphite, polymer, and copper. Non-constrained circuit boards can be made with standard glass, polymer and copper materials.

In one preferred embodiment of the invention, the core is formed of a conductive materials such as copper. The manner in which the inner layers are formed for such an embodiment is shown in FIG. 2. The core (102) is first drilled with an oversize hole (204). Next, the hole (204) is filled with an non-conductive filler (205) such as epoxy. This filler (205) material should be compounded such that the CTE matches that of the core material. The core (102) is then laminated with dielectric material forming insulating layers (201 and 202). A smaller hole (203) is then drilled through the insulating layers (201 and 202) and through the non-conductive filler (205). This creates an insulated through-hole in the core which will be used to form the side-to-side interconnects in the finished board.

In other embodiments of the inner layers, the core may be non-conductive. In this case, only the smaller holes will have to be drilled to form the side-to-side interconnects. In still another embodiment, the core layer (102) may be delivered with a plurality of non-conductive plugs in place. When building the board, the user will only drill the smaller holes (203) where the wishes to place an interconnect, thus saving the user two steps (drilling the larger hole 204 and placing filler 205). Even this step may be saved if the core is delivered with pre-positioned conductive pins through the non-conductive pins.

FIG. 3 illustrates how the first circuit layer is added using the core (102) as a tooling plate. The inner layers comprising the core (102) and the insulating layers (201 and 202) are plated forming the first conductive layers (301 and 302). This also forms a conductive layer (303) in the through-hole 203, thus electrically interconnecting layers 301 and 302. The board is then etched in a conventional manner exposing dielectric layers 201 and 202 as needed to form the necessary circuit pattern.

Alternatively, the core may instead be laminated with a layer that consists of both the dielectric material and a conductive foil (such as copper). Both the conductive foil and the dielectric layer are then removed (by drilling, micro-blasting, laser, or some other way) where the interconnect is to be formed. These areas are then plated to form the interconnects or conductive passages. Next, the conductive layers are etched in a conventional manner to form the necessary circuit definition patterns.

Additional layers are added as shown in FIG. 4. Insulating layers (310 and 311) are laminated onto either side of the board. Where interconnects between layers are needed, vias (such as 314) are formed by removing the insulating layer by processes such as micro-blast or laser. Conducting layers (312 and 313) are electro-plated onto the insulating layers (310 and 311). This electro-plating also plates the vias (such as 314) forming the interconnects between the first conducting layers (301 and 302) and the second conducting layers (313 and 312). The newly added conducting layers are then patterned by etching to form the circuit definition.

Alternatively, the additional layers may be added by laminating layers consisting of both the dielectric material and a conductive foil (such as copper). Both the conductive foil and the dielectric layer are then removed (by drilling, micro-blasting, laser, or some other way) where the interconnects are to be formed. These areas are then plated to form the conductive vias. The conductive layers are then etched in a conventional manner to form the necessary circuit definition patterns.

In the preferred embodiment of the invention, the vias serve an additional function. The material used in forming the vias is also thermally conductive. This allows heat to be transferred from components mounted on the printed wiring board to the core. The thermal interface region of the printed wiring board is then used to dissipate the excess heat.

Subsequent layers are added in a like-manner. This allows a sequential build-up of layers for the double-side board. Because of the blind-plated vias and the use of through-holes, interconnections between the layers and side-to-side interconnects are easily formed during manufacture. In turn, there is automatic alignment of interconnecting traces even on opposite sides of the printed wiring board.

Figure 5:
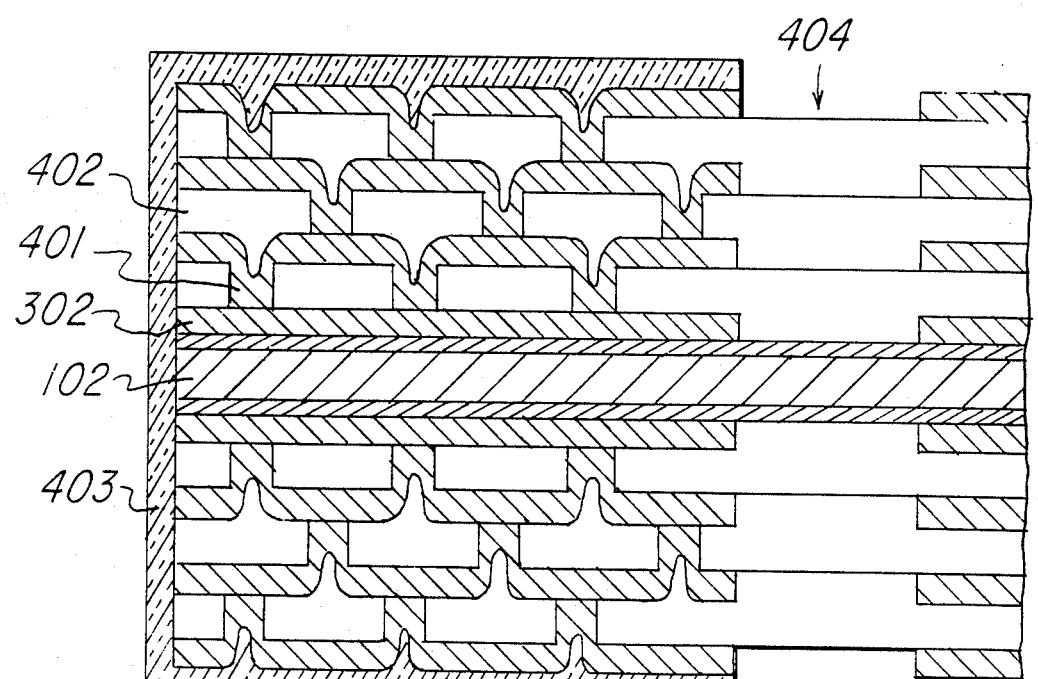
FIG. 5 illustrates the thermal interface region of the printed wiring board.

FIG. 5 is a view of the thermal interface region of the present invention. In the preferred embodiment of the invention, this region is located along the edge of the printed wiring board. Alternative embodiments may employ the thermal interface elsewhere on the board. The thermal interface region is an integral part of the printed wiring board and is built in the manner described above. That is, the region is built up from the core (102), has conductive layers (302), blind-plated vias (401) and insulating layers (402). The core (102) in the preferred embodiment of the invention is made of copper or other thermally conductive material. The conducting layers (such as 302) and the vias (401) are also composed of a thermally transmissive material. The edge of the printed wiring board is plated with nickel (403), or other suitable material, after fabrication forming a durable contact surface and enhancing thermal conductivity.

In the thermal transfer region, the vias (such as 401) are spaced relatively closely and optionally staggered. The number of blind holes, spacing of the staggered combinations, and thickness of plating are all optimized allow a maximum of heat to be conducted from the core (102) to the outside of the printed wiring board. In the preferred embodiment of the invention, the conductive layers (such as 302) are not patterned as they were for circuit definition. Again this is to allow a maximum of heat transfer. However as the vias electrically short all of the conducting layers together, it is necessary to pattern (404), the conductive layers outside of the thermal interface region, to ensure circuit definition integrity.

While certain presently preferred embodiments of the invention have been discussed, these are intended merely as illustrative. Other embodiments of the invention are possible without departing from the scope of the invention. All limitations are set out in the claims below.

What is claimed is:

1. A printed wiring board for mounting components thereto, said printed wiring board including:
   a thermally conductive core; and
   a first thermal interface region having a first outer surface, said first thermal interface disposed over and in thermal contact with said core for conducting heat generated by said components to said core via said first thermal interface region;
   said first thermal interface region having a plurality of interlaced thermally insulating and thermally conductive layers, one of said thermally conductive layers being disposed on said first outer surface, and plural thermally conductive vias, each said via coupled to an adjacent pair of said thermally conductive layers extending from said thermally conductive core to said thermally conductive layer on said first outer surface of said first thermal interface region.

2. The printed wiring board as claimed in claim 1 wherein said core is substantially composed of metal.

3. The printed wiring board as claimed in claim 1 wherein said core is substantially composed of a thermally conductive composite material.

4. The printed wiring board as claimed in claim 1 wherein said core is substantially composed of metal-clad composite material.

5. The printed wiring board as claimed in claim 1 wherein said printed wiring board is further plated with a durable metal over said thermal interface region.

6. The printed wiring board as claimed in claim 5 wherein said durable metal is substantially comprised of nickel.

7. The printed wiring board as claimed in claim 5 wherein said plated metal is disposed on the exterior of said board, is thermally conductive and contacts said thermally conductive layers.

8. The printed wiring board as claimed in claim 6 wherein said plated metal is disposed on the exterior of said board, is thermally conductive and contacts said thermally conductive layers and said vias on said first outer surface.

9. The printed wiring board as claimed in claim 1 wherein said vias on adjacent ones of said layers are staggered.

10. The printed wiring board as claimed in claim 1 further including an electrically conductive pattern disposed on said first outer surface and electrically insulated from said vias.

11. The printed wiring board as claimed in claim 1, further including component mounting means disposed on said first outer surface.

12. The printed wiring board as claimed in claim 1, further including a second thermal interface region having a second outer surface, said second thermal interface disposed over and in thermal contact with said core and disposed on a side of said core opposite said first thermal interface for conducting heat generated by said components to said core via said second thermal interface region;

said second thermal interface region having a plurality of interlaced thermally insulating and thermally conductive layers, one of said thermally conductive layers being disposed on said second outer surface, and plural thermally conductive vias, each said via coupled to an adjacent pair of said thermally conductive layers extending from said thermally conductive core to said thermally conductive layer on said second outer surface of said second thermal interface.

13. The printed wiring board as claimed in claim 7, further including a second thermal interface region having a second outer surface, said second thermal interface disposed over and in thermal contact with said core and disposed on a side of said core opposite said first thermal interface for conducting heat generated by said components to said core via said second thermal interface region;

said second thermal interface region having a plurality of interlaced thermally insulating and thermally conductive layers, one of said thermally conductive layers being disposed on said second outer surface, and plural thermally conductive vias, each said via coupled to an adjacent pair of said thermally conductive layers extending from said thermally conductive core to said thermally conductive layer on said second outer surface of said second thermal interface.

14. The printed wiring board as claimed in claim 8, further including a second thermal interface region having a second outer surface, said second thermal interface disposed over and in thermal contact with said core and disposed on a side of said core opposite said first thermal interface for conducting heat generated by said components to said core via said second thermal interface region;

said second thermal interface region having a plurality of interlaced thermally insulating and thermally conductive layers, one of said thermally conductive layers being disposed on said second outer surface, and plural thermally conductive vias, each said via coupled to an adjacent pair of said thermally conductive layers extending from said thermally conductive core to said thermally conductive layer on said second outer surface of said second thermal interface.

15. The printed wiring board as claimed in claim 9, further including a second thermal interface region having a second outer surface, said second thermal interface disposed over and in thermal contact with said core and disposed on a side of said core opposite said first thermal interface for conducting heat generated by said components to said core via said second thermal interface region;

said second thermal interface region having a plurality of interlaced thermally insulating and thermally conductive layers, one of said thermally conductive layers being disposed on said second outer surface, and plural thermally conductive vias, each said via coupled to an adjacent pair of said thermally conductive layers extending from said thermally conductive core to said thermally conductive layer on said second outer surface of said second thermal interface.

16. The printed wiring board as claimed in claim 10, further including a second thermal interface region having a second outer surface, said second thermal interface disposed over and in thermal contact with said core and disposed on a side of said core opposite said first thermal interface for conducting heat generated by said components to said core via said second thermal interface region;

said second thermal interface region having a plurality of interlaced thermally insulating and thermally conductive layers, one of said thermally conductive layers being disposed on said second outer surface, and plural thermally conductive vias, each said via coupled to an adjacent pair of said thermally conductive layers extending from said thermally conductive core to said thermally conductive layer on said second outer surface of said second thermal interface.

17. The printed wiring board as claimed in claim 11, further including a second thermal interface region having a second outer surface, said second thermal interface disposed over and in thermal contact with said core and disposed on a side of said core opposite said first thermal interface for conducting heat generated by said components to said core via said second thermal interface region;

said second thermal interface region having a plurality of interlaced thermally insulating and thermally conductive layers, one of said thermally conductive layers being disposed on said second outer surface, and plural thermally conductive vias, each said via coupled to an adjacent pair of said thermally conductive layers extending from said thermally conductive core to said thermally conductive layer on said second outer surface of said second thermal interface.

* * * * *